United States Patent
Wu et al.

(10) Patent No.: US 8,415,729 B2
(45) Date of Patent: Apr. 9, 2013

(54) POWER DEVICE WITH TRENCHED GATE STRUCTURE AND METHOD OF FABRICATING THE SAME

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 104 days.

(21) Appl. No.: 13/081,500

(22) Filed: Apr. 7, 2011

(65) Prior Publication Data

US 2012/0256230 A1    Oct. 11, 2012

(51) Int. Cl.
*H01L 27/108* (2006.01)
(52) U.S. Cl.
USPC .......................................... 257/298; 257/330
(58) Field of Classification Search ............... 257/298.33
See application file for complete search history.

(56) References Cited

U.S. PATENT DOCUMENTS

| 6,410,959 B2* | 6/2002 | Numazawa et al. .......... 257/330 |
| 2003/0030089 A1* | 2/2003 | Sumino et al. ................ 257/298 |
| 2012/0199984 A1* | 8/2012 | Fujita et al. .................... 257/774 |

* cited by examiner

*Primary Examiner* — Howard Weiss
*Assistant Examiner* — Steven Rao
(74) *Attorney, Agent, or Firm* — Winston Hsu; Scott Margo

(57) ABSTRACT

A power device with trenched gate structure, includes: a substrate having a first face and a second face opposing to the first face, a body region of a first conductivity type disposed in the substrate, a base region of a second conductivity type disposed in the body region, a cathode region of the first conductivity type disposed in the base region, an anode region of the second conductivity type disposed in the substrate at the second face a trench disposed in the substrate and extending from the first face into the body region, and the cathode region encompassing the trench, wherein the trench has a wavelike sidewall, a gate structure disposed in the trench and an accumulation region disposed in the body region and along the wavelike sidewall. The wavelike sidewall can increase the base current of the bipolar transistor and increase the performance of the IGBT.

14 Claims, 4 Drawing Sheets

POWER DEVICE WITH TRENCHED GATE STRUCTURE AND METHOD OF FABRICATING THE SAME

BACKGROUND OF THE INVENTION

1. Field of the Invention

The present invention relates to a power device with trenched gate structure and a method of fabricating the same, and more particularly to a structure which can increase the current density of the power device and the method of fabricating the same.

2. Description of the Prior Art

In recent years, the power source apparatus used in the field of the power electronics is required to be miniaturized and to exhibit a high performance. Therefore, in the power semiconductor element, vigorous efforts are being made in an attempt to improve the performance of the power source apparatus in respect of the improvements in the breakdown voltage.

Particularly, a power IBGT (Insulated Gate Bipolar Transistor) excellent in the breakdown voltage and in the adaptability for the large current is provided. The power IGBT is an element that is driven by a MOS gate. Widely known to the art there are two kinds of the power IGBT, i.e., a power IGBT of a planar structure, in which a MOS gate is formed in the shape of a flat plate, and a power IGBT of a trench structure, in which the MOS gate is buried inside a trench. Currently, a power IGBT of a trench structure has become a focus of attention because its structure makes it easy to obtain low on-resistance characteristics.

The power IGBT is a bipolar junction transistor (BJT) driven by an n-Metal-Insulation-Semiconductor Field Effect Transistor (n-MISFET), wherein the emitter and collector of the bipolar transistor constitute the emitter and collector of the IGBT, respectively, and the base current of bipolar transistor is the drain current of n-MISFET which is controlled by the gate electrode.

However, in order to get better performance of the power IGBT, there is still a need for increasing the current density of the power IGBT.

SUMMARY OF THE INVENTION

In light of above, the present invention provides a novel structure which can increase the current density of the power IGBT.

According to a first embodiment of the present invention, a power device with trenched gate structure, comprising: a substrate having a first face and a second face opposing to the first face, a body region of a first conductivity type disposed in the substrate, a base region of a second conductivity type disposed in the body region, a cathode region of the first conductivity type disposed in the base region, an anode region of the second conductivity type disposed in the substrate at the second face, a trench disposed in the substrate and extending from the first face into the body region, and the cathode region encompassing the trench, wherein the trench has a wavelike sidewall, a gate structure disposed in the trench, an accumulation region disposed in the body region and along the wavelike sidewall.

According to a second embodiment of the present invention, a power device with trenched gate structure, first, a substrate having a body region of a first conductivity type therein is provided, wherein the substrate has a first face and a second face opposing to the first face. A first trench is formed in the body region, wherein the first trench has a first opening. Then, a mask layer is formed on the sidewall of the first trench. Later, a second trench having a second opening is formed by taking the mask layer as a mask, the second trench extending from a bottom of a sidewall of the first trench, wherein the second opening is smaller than the first opening. Finally, the mask layer is removed.

The wavelike sidewall of the trench gate structure elongates the accumulation region, therefore, the current density of the IGBT is increased, and the performance of the IGBT becomes better.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
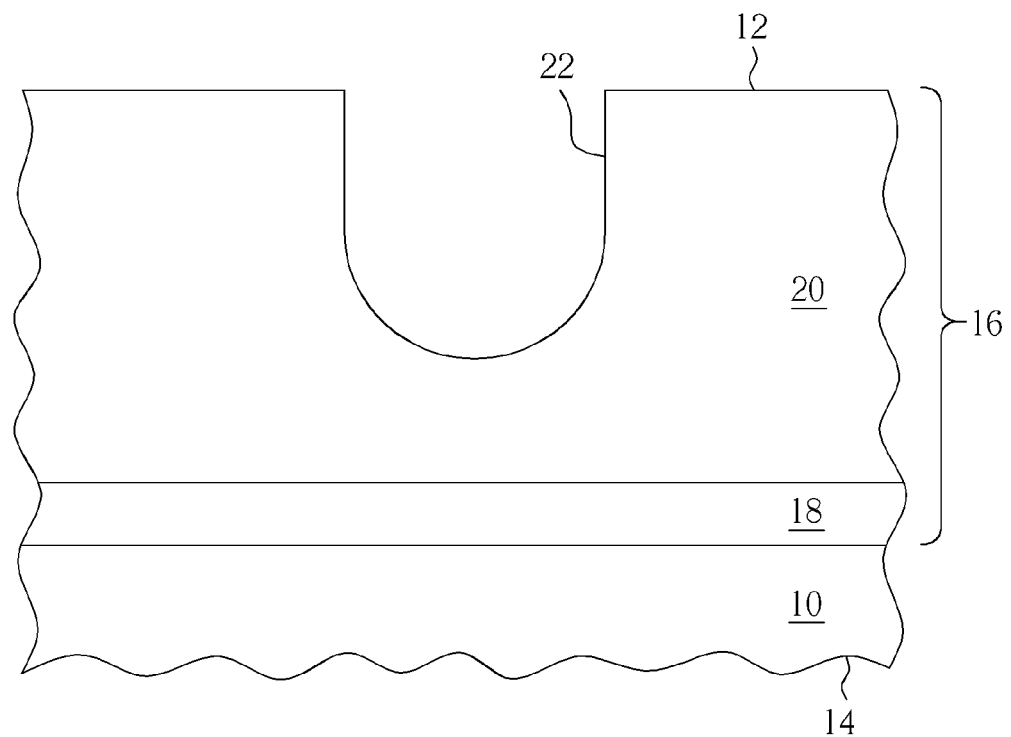
FIG. 1 to FIG. 6 depict a method of fabricating a power device with trenched gate structure the present invention schematically.

FIG. 1 to FIG. 6 depict a method of fabricating a power device with trenched gate structure according to a first embodiment of the present invention. As shown in FIG. 1, first, a substrate 10 has a first face 12 and a second face 14 opposing to the first face 12 is provided. Then, a body region 16 of a first conductivity type is formed in the substrate 10. The first conductivity type is preferably n-type, but not limited to it. Based on different product requirements, the first conductivity type can be p-type. The body region 16 can be divided into two regions, a buffer region 18 and a drift region 20. The drift region 20 is disposed above the buffer region 18. The buffer region 18 and the drift region 20 can be formed by ion implantation process by doping n-type dopants from the first face 12 into the substrate 10. The n-type dopant concentration of the drift region 20 maybe less than that of the buffer region 18. After that, a first trench 22 extending from the first face 12 to the second face 14 is formed in the drift region 20.

Figure 2:
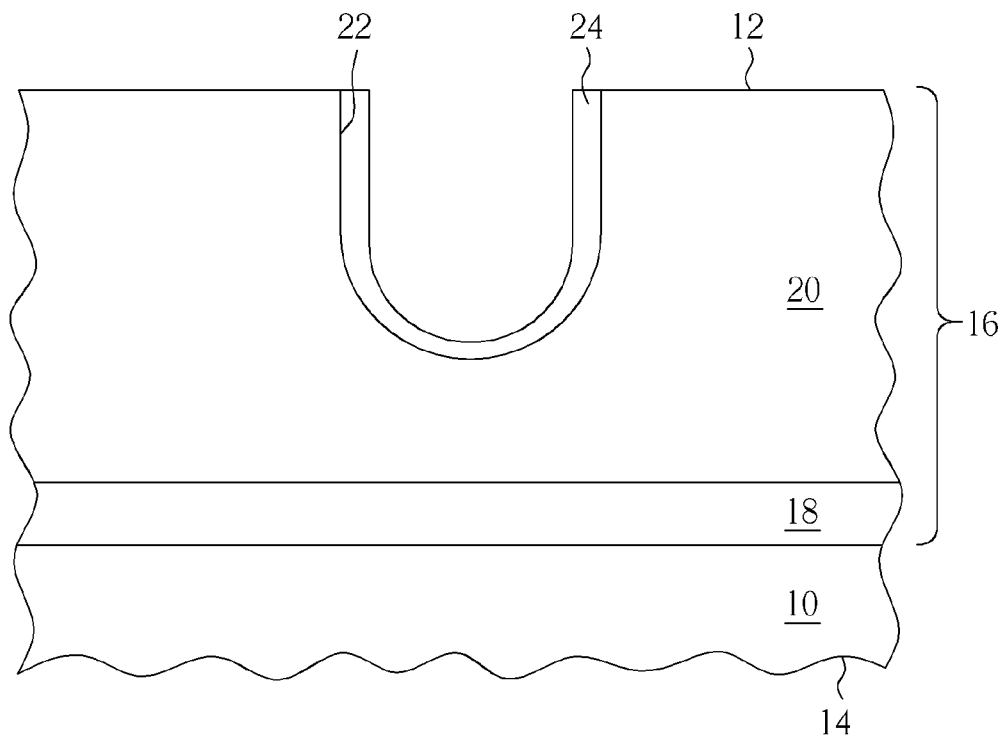
Figure 3:
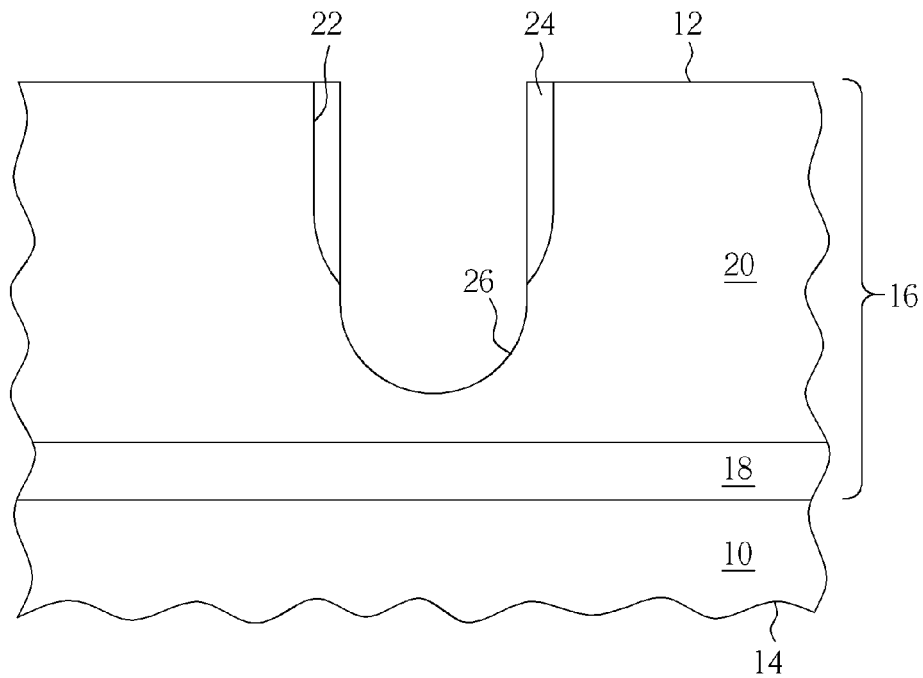
Figure 4:
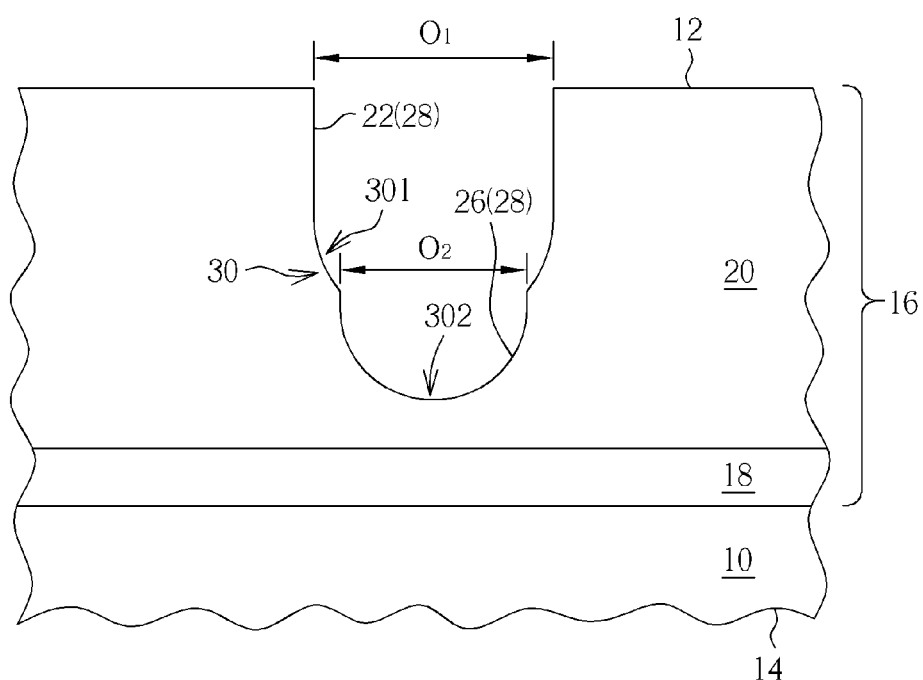

As shown in FIG. 2, a mask layer 24 such as a silicon oxide layer is formed at the inner sidewall of the first trench 22. As shown in FIG. 3, a second trench 26 is formed extending from the bottom of a sidewall of the first trench 22 by taking the mask layer 24 as a mask. As shown in FIG. 4, the mask layer 24 is removed. At this point the first trench 22 and the second trench 26 form a composite trench 28 has a wavelike sidewall 30. The wavelike sidewall 30 refers to the wall of the composite trench 28 embedded in the substrate 10. The wavelike sidewall 30 includes at least two cambered surfaces 301, 302. The curvatures of the cambered surfaces 301, 302 of the wavelike sidewall 30 can be the same or different. The opening of the second trench $0_2$ is smaller than the opening $0_1$ of the first trench.

Figure 5:
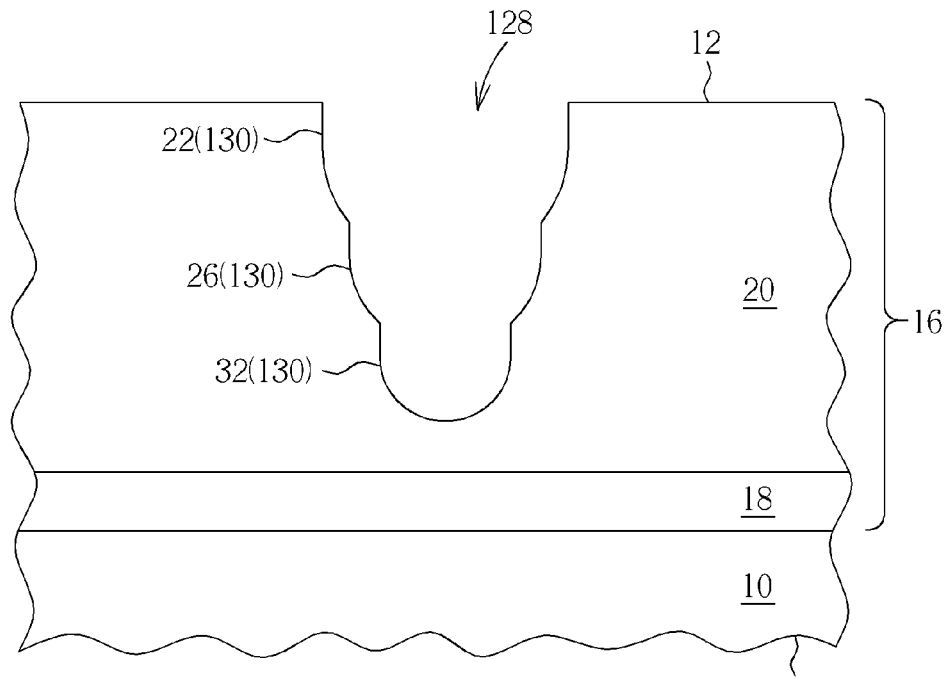

The steps in FIG. 2 and FIG. 3 can be repeated many times until enough trenches are formed under the first trench 22. For example, as shown in FIG. 5, a varied type composite trench 128 has a third trench 32 extending from the bottom of a sidewall of the second trench 26, and the first trench 22, the second trench 26 and the third trench 32 form a varied type wavelike sidewall 130.

Figure 6:
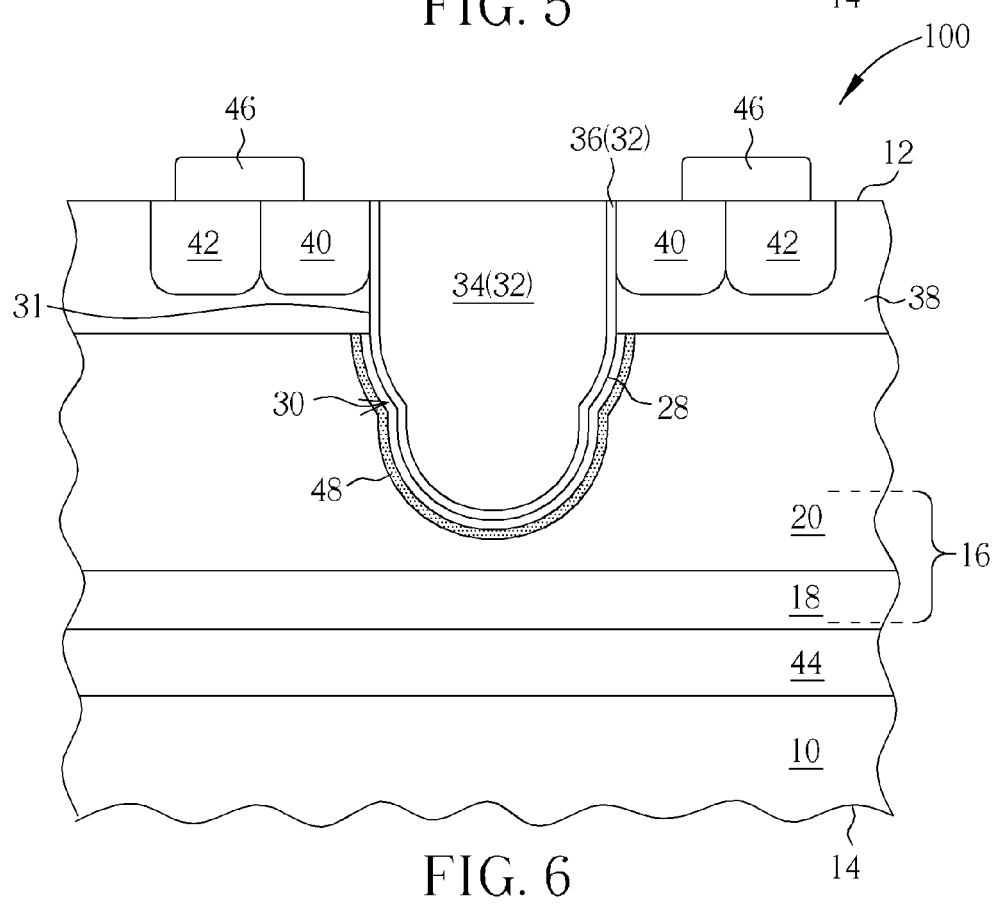

As shown in FIG. 6, a gate structure 32 including a gate 34 and a gate dielectric layer 36 are formed in the composite trench 28. Later, a base region 38 of a second conductivity type is formed at the upper portion of the body region 16 and adjacent to the first face 12. The second conductivity type is preferably p-type but not limit to it. The second conductivity type may be n-type based on different requirements. After that, a cathode region 40 of the first conductivity type is formed in the base region 38 and surrounds the composite trench 28. Later, an ohmic contacting region 42 of the second conductivity type is formed in the base region 38 and surrounds the cathode region 40.

Subsequently, an anode region 44 of the second conductivity is form at the second face 14 of the substrate 10. Then, a cathode contact pad 46 can be formed on the ohmic contacting region 42 and the cathode region 40. At this point, a method of fabricating a power device with trenched gate structure 100 such as an IGBT is completed.

According to a second embodiment of the present invention, a power device with trenched gate structure is provided. The power device with trenched gate structure includes a substrate 10 having a first face 12 and a second face 14 opposing to the first face 12, a body region 16 of a first conductivity type disposed in the substrate 10. The body region 16 can be divided into a buffer region 18 and a drift region 20. The drift region 20 is disposed above the buffer region 18. A base region 38 of a second conductivity type is disposed in the upper portion of the body region 16. A cathode region 40 of the first conductivity type is disposed in the base region 38. An ohmic contacting region 42 is disposed beside the cathode region 40 in the base region 38, and the ohmic contacting region 42 surrounds the cathode region 40.

A composite trench 28 is disposed in the substrate 10 and extends from the first face 12 into the body region 16, and the cathode region 40 encompasses the composite trench 28, wherein the composite trench 28 has a wavelike sidewall 30. The composite trench 28 further comprises a vertical sidewall 31 contacting the base region 38 and the cathode region 40. An anode region 44 of the second conductivity type is disposed in the substrate 10 at the second face 14. A gate structure 32 includes a gate 34 and a gate dielectric layer 36 is disposed in the composite trench 28. A cathode contact pad 46 is disposed on the ohmic contacting region 42 and the cathode region 40. The first conductivity type is preferably n-type, and the second conductivity type is preferably p-type. However, according to other embodiment, the first conductivity type can be p-type and the second conductivity type can be n-type.

It is noted that when a voltage difference is applied to the gate 34, the cathode region 40 and the anode region 44, an accumulation region 48 may form, and provide base current for a bipolar transistor in the IGBT. The accumulation region 48 is disposed in the body region 38 and along the wavelike sidewall 30.

Please refer to FIG. 4 to see the structure of the wavelike sidewall 30 of the composite trench 28 more clearly. It is one of the features that the wavelike sidewall 30 includes at least two cambered surfaces 301,302. The curvatures of the cambered surfaces 301,302 of the wavelike sidewall 30 can be the same or different.

Figure 7:
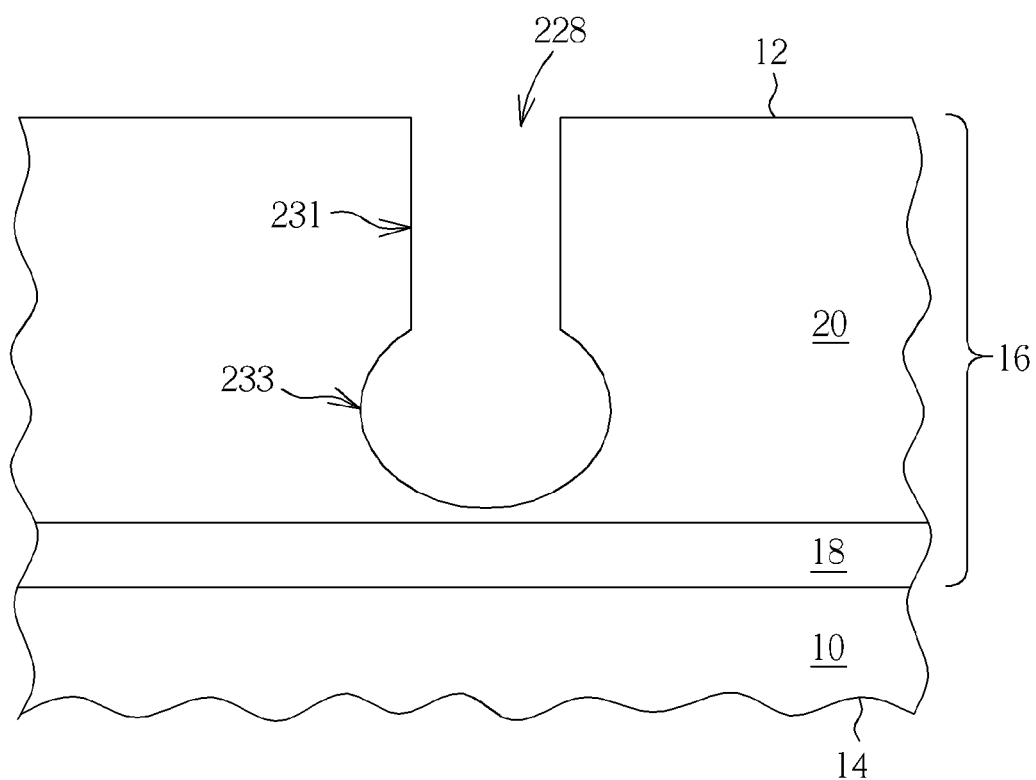
FIG. 7 depict a varied type of a composite trench schematically.

Please refer to FIG. 5 for a varied type of the wavelike sidewall 130, the wavelike sidewall 130 can include more than two cambered surfaces with their individual curvatures. Alternatively, as show in FIG. 7, the composite trench 228 can include a vertical sidewall 231 and a spherical bottom 233.

The power device with trenched gate structure has a wavelike sidewall so that a surface of the sidewall of the trenched gate increase is increased. Therefore, the accumulation region along the wavelike sidewall of the trenched gate structure is elongated as well. As a result, the base current of the bipolar transistor in the IGBT is enlarged and the performance of the IGBT becomes better.

Those skilled in the art will readily observe that numerous modifications and alterations of the device and method may be made while retaining the teachings of the invention.

What is claimed is:

1. A power device with trenched gate structure, comprising:
   a substrate having a first face and a second face opposing to the first face;
   a body region of a first conductivity type disposed in the substrate;
   a base region of a second conductivity type disposed in the body region;
   a cathode region of the first conductivity type disposed in the base region;
   an anode region of the second conductivity type disposed in the substrate at the second face;
   a trench disposed in the substrate and extending from the first face into the body region, and the cathode region encompassing the trench, wherein the trench has a wavelike sidewall;
   a gate structure disposed in the trench; and
   an accumulation region disposed in the body region and along the wavelike sidewall.

2. The power device with trenched gate structure of claim 1, wherein the body region further comprising:
   a drift region of the first conductivity type; and
   a buffer region of the first conductivity type disposed below the drift region.

3. The power device with trenched gate structure of claim 2, wherein the wavelike sidewall is disposed in the drift region.

4. The power device with trenched gate structure of claim 1, wherein the trench further comprises a vertical sidewall contacting the base region and the cathode region.

5. The power device with trenched gate structure of claim 1, wherein the wavelike sidewall comprises a first curvature.

6. The power device with trenched gate structure of claim 5, wherein the wavelike sidewall comprises a second curvature.

7. The power device with trenched gate structure of claim 6, wherein the second curvature is different from the first curvature.

8. The power device with trenched gate structure of claim 1, wherein the wavelike sidewall comprises at least two curvatures.

9. The power device with trenched gate structure of claim 1, further comprising an ohmic contacting region of the second conductive type disposed in the base region and surrounding the cathode region.

10. A method of fabricating a power device with trenched gate structure, comprising:
    providing a substrate having a body region of a first conductivity type therein, wherein the substrate has a first face and a second face opposing to the first face;
    forming a first trench in the body region, wherein the first trench has a first opening;
    forming a mask layer on the sidewall of the first trench;
    forming a second trench having a second opening by taking the mask layer as a mask, the second trench extending from a bottom of a sidewall of the first trench, wherein the second opening is smaller than the first opening; and
    removing the mask layer.

11. The method of fabricating a power device with trenched gate structure claim 10, wherein the first trench and the second trench form a composite trench having a wavelike sidewall.

12. The method of fabricating a power device with trenched gate structure claim 11, further comprising:
 after removing the mask layer, forming a gate structure in the composite trench;
 forming a base region of a second conductivity type in the upper portion of the body region; and
 forming a cathode region of the first conductivity type in the base region.

13. The method of fabricating a power device with trenched gate structure of claim 12, further comprising:
 after forming the cathode region, forming an ohmic contacting region adjacent to the cathode region in the base region.

14. A power device with trenched gate structure, comprising:
 a substrate having a first face and a second face opposing to the first face;
 a body region of a first conductivity type disposed in the substrate;
 a base region of a second conductivity type disposed in the body region;
 a cathode region of the first conductivity type disposed in the base region;
 an anode region of the second conductivity type disposed in the substrate at the second face;
 a composite trench disposed in the substrate and extending from the first face into the body region, and the cathode region encompassing the composite trench, wherein the composite trench consisting of a first trench and a second trench extending from a bottom of a sidewall of the first trench, and the composite trench has a wavelike sidewall;
 a gate structure disposed in the composite trench;
 an accumulation region disposed in the body region and along the wavelike sidewall.

* * * * *